United States Patent
Chen

(10) Patent No.: US 8,293,600 B2
(45) Date of Patent: Oct. 23, 2012

(54) THERMALLY STABILIZED ELECTRODE STRUCTURE

(75) Inventor: Shih-Hung Chen, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 13/311,637

(22) Filed: Dec. 6, 2011

(65) Prior Publication Data

US 2012/0077309 A1    Mar. 29, 2012

Related U.S. Application Data

(62) Division of application No. 12/054,861, filed on Mar. 25, 2008, now Pat. No. 8,084,842.

(51) Int. Cl.
*H01L 21/8236* (2006.01)

(52) U.S. Cl. ........ 438/253; 438/102; 438/104; 438/130; 438/132; 438/257; 438/382; 438/385; 438/396; 438/595; 438/596; 257/246; 257/359; 257/536; 257/773; 257/E21.001; 257/E21.08; 257/E27.004; 257/E27.071; 257/E45.002; 257/E47.001; 365/163; 365/148

(58) Field of Classification Search .............. 257/4, 200, 257/213, 246, 359, 528, 536, 773, E21.001, 257/E21.068, E27.004, E27.071, E45.002, 257/E47.001; 438/90, 102, 104, 130, 132, 438/257, 253, 382, 385, 396, 595, 596, 704; 365/163, 148

See application file for complete search history.

(56) References Cited

U.S. PATENT DOCUMENTS

| | | |
|---|---|---|
| 5,166,758 A | 11/1992 | Ovshinsky et al. |
| 5,177,567 A | 1/1993 | Klersy et al. |
| 5,688,713 A | 11/1997 | Linliu et al. |
| 5,789,277 A | 8/1998 | Zahorik et al. |
| 5,814,527 A | 9/1998 | Wolstenholme et al. |
| 5,879,955 A | 3/1999 | Gonzalez et al. |
| 5,952,671 A | 9/1999 | Reinberg et al. |
| 5,970,336 A | 10/1999 | Wolstenholme et al. |
| 5,998,244 A | 12/1999 | Wolstenholme et al. |
| 6,011,725 A | 1/2000 | Eitan |
| 6,104,038 A | 8/2000 | Gonzalez et al. |
| 6,147,395 A | 11/2000 | Gilgen |
| 6,150,253 A | 11/2000 | Doan et al. |

(Continued)

FOREIGN PATENT DOCUMENTS

WO    00/79539    12/2000

(Continued)

OTHER PUBLICATIONS

Yonehara, T. et al., "Control of Grain Boundary Location by Selective Nucleation OVer Amorphous Substrates," Mat. Res. Soc. Symp. Proc., vol. 106, 1998, pp. 21-26.

(Continued)

*Primary Examiner* — Meiya Li
(74) *Attorney, Agent, or Firm* — Haynes Beffel & Wolfeld LLP

(57) ABSTRACT

Memory devices and methods for manufacturing are described herein. A memory device as described herein includes a first electrode layer, a second electrode layer, and a thermal isolation structure including a layer of thermal isolation material between the first and second electrode layers. The first and second electrode layers and the thermal isolation structure define a multi-layer stack having a sidewall. A sidewall conductor layer including a sidewall conductor material is on the sidewall of the multi-layer stack. The sidewall conductor material has an electrical conductivity greater than that of the thermal isolation material. A memory element including memory material is on and in contact with the second electrode layer.

14 Claims, 11 Drawing Sheets

U.S. PATENT DOCUMENTS

| | | | |
|---|---|---|---|
| 6,153,890 | A | 11/2000 | Wolstenholme et al. |
| 6,185,122 | B1 | 2/2001 | Johnson et al. |
| 6,189,582 | B1 | 2/2001 | Reinberg et al. |
| 6,236,059 | B1 | 5/2001 | Wolstenholme et al. |
| RE37,259 | E | 7/2001 | Ovshinsky |
| 6,271,090 | B1 | 8/2001 | Huang et al. |
| 6,314,014 | B1 | 11/2001 | Lowrey et al. |
| 6,320,786 | B1 | 11/2001 | Chang et al. |
| 6,339,544 | B1 | 1/2002 | Chiang et al. |
| 6,420,215 | B1 | 7/2002 | Knall et al. |
| 6,420,725 | B1 | 7/2002 | Harshfield |
| 6,429,064 | B1 | 8/2002 | Wicker |
| 6,462,353 | B1 | 10/2002 | Gilgen |
| 6,501,111 | B1 | 12/2002 | Lowrey |
| 6,512,241 | B1 | 1/2003 | Lai |
| 6,514,820 | B2 | 2/2003 | Ahn et al. |
| 6,534,781 | B2 | 3/2003 | Dennison |
| 6,545,903 | B1 | 4/2003 | Wu |
| 6,566,700 | B2 | 5/2003 | Xu |
| 6,567,293 | B1 | 5/2003 | Lowrey et al. |
| 6,579,760 | B1 | 6/2003 | Lung |
| 6,593,176 | B2 | 7/2003 | Dennison |
| 6,596,589 | B2 | 7/2003 | Tseng |
| 6,597,009 | B2 | 7/2003 | Wicker |
| 6,605,527 | B2 | 8/2003 | Dennison et al. |
| 6,607,974 | B2 | 8/2003 | Harshfield |
| 6,621,095 | B2 | 9/2003 | Chiang et al. |
| 6,639,849 | B2 | 10/2003 | Takahashi et al. |
| 6,674,115 | B2 | 1/2004 | Hudgens et al. |
| 6,744,088 | B1 | 6/2004 | Dennison |
| 6,750,079 | B2 | 6/2004 | Lowrey et al. |
| 6,797,979 | B2 | 9/2004 | Chiang et al. |
| 6,800,504 | B2 | 10/2004 | Li et al. |
| 6,815,704 | B1 | 11/2004 | Chen |
| 6,861,267 | B2 | 3/2005 | Xu et al. |
| 6,864,503 | B2 | 3/2005 | Lung |
| 6,867,638 | B2 | 3/2005 | Saiki et al. |
| 6,888,750 | B2 | 5/2005 | Walker et al. |
| 6,894,305 | B2 | 5/2005 | Yi et al. |
| 6,897,467 | B2 | 5/2005 | Doan et al. |
| 6,903,362 | B2 | 6/2005 | Wyeth et al. |
| 6,909,107 | B2 | 6/2005 | Rodgers et al. |
| 6,936,840 | B2 | 8/2005 | Sun et al. |
| 6,992,932 | B2 | 1/2006 | Cohen |
| 7,852,658 | B2 | 12/2010 | Liu et al. |
| 8,084,842 | B2 | 12/2011 | Chen |
| 2002/0113273 | A1 | 8/2002 | Hwang et al. |
| 2005/0018526 | A1 | 1/2005 | Lee |
| 2005/0029502 | A1 | 2/2005 | Hudgens |
| 2005/0062087 | A1 | 3/2005 | Chen et al. |
| 2005/0093022 | A1 | 5/2005 | Lung |
| 2005/0127347 | A1 | 6/2005 | Choi et al. |
| 2005/0201182 | A1 | 9/2005 | Osada et al. |
| 2005/0215009 | A1 | 9/2005 | Cho |
| 2005/0263829 | A1 | 12/2005 | Song et al. |
| 2006/0038221 | A1 | 2/2006 | Lee et al. |
| 2006/0081961 | A1 | 4/2006 | Tanaka et al. |
| 2006/0108667 | A1 | 5/2006 | Lung |
| 2006/0110888 | A1 | 5/2006 | Cho et al. |
| 2006/0118913 | A1 | 6/2006 | Yi et al. |
| 2006/0154185 | A1 | 7/2006 | Ho et al. |
| 2006/0169968 | A1 | 8/2006 | Happ |
| 2006/0226409 | A1 | 10/2006 | Burr et al. |
| 2006/0234138 | A1 | 10/2006 | Fehlhaber et al. |
| 2006/0284157 | A1 | 12/2006 | Chen et al. |
| 2006/0284214 | A1 | 12/2006 | Chen |
| 2006/0286709 | A1 | 12/2006 | Lung et al. |
| 2007/0030721 | A1 | 2/2007 | Segal et al. |
| 2007/0037101 | A1 | 2/2007 | Morioka |
| 2007/0045606 | A1 | 3/2007 | Magistretti et al. |
| 2007/0090461 | A1 | 4/2007 | Eliason et al. |
| 2007/0096162 | A1 | 5/2007 | Happ et al. |
| 2007/0096248 | A1 | 5/2007 | Philipp et al. |
| 2007/0108429 | A1 | 5/2007 | Lung |
| 2007/0108431 | A1 | 5/2007 | Chen et al. |
| 2007/0109843 | A1 | 5/2007 | Lung et al. |
| 2007/0115794 | A1 | 5/2007 | Lung |
| 2007/0121363 | A1 | 5/2007 | Lung |
| 2007/0126040 | A1 | 6/2007 | Lung |
| 2007/0131980 | A1 | 6/2007 | Lung |
| 2007/0147105 | A1 | 6/2007 | Lung et al. |
| 2007/0158633 | A1 | 7/2007 | Lai et al. |
| 2007/0158690 | A1 | 7/2007 | Ho et al. |
| 2007/0161186 | A1 | 7/2007 | Ho |
| 2007/0173063 | A1 | 7/2007 | Lung |
| 2007/0176261 | A1 | 8/2007 | Lung |
| 2007/0224726 | A1 | 9/2007 | Chen et al. |
| 2007/0235710 | A1 | 10/2007 | Matsuzaki et al. |
| 2007/0235811 | A1 | 10/2007 | Furukawa et al. |
| 2007/0246699 | A1 | 10/2007 | Lung |
| 2007/0257300 | A1 | 11/2007 | Ho et al. |
| 2007/0274121 | A1 | 11/2007 | Lung et al. |
| 2007/0285960 | A1 | 12/2007 | Lung et al. |
| 2008/0014676 | A1 | 1/2008 | Lung et al. |
| 2008/0191187 | A1 | 8/2008 | Lung et al. |

FOREIGN PATENT DOCUMENTS

| | | |
|---|---|---|
| WO | 01/45108 | 6/2001 |
| WO | 0225733 A2 | 3/2002 |

OTHER PUBLICATIONS

"Magnetic Bit Boost," www.sciencenews.org, Dec. 18 & 25, 2004, p. 389, vol. 166.

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, FL, 2pp.

Adler, D. et al., "Threshold Switching in Chalcogenide-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "A Highly Manufacturable High Density Phase Change Memory of 64 Mb and Beyond," IEEE IEDM 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Atwood, G, et al., "90 nm Phase Change Technology with u Trench and Lance Cell Elements," VLSI Technology, Systems and Applications, Apr. 23-25, 2007, pp. 1-2.

Axon Technologies Corporation paper: Technology Description, pp. 1-6, 1997.

Bedeschi, F. et al., "4-MB Mosfet-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al., "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24um-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase-Change Memory Cell for Embedded and Stand-Alone Non-Volatile Memory Applications," 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n. Junctions Using Vapor Phase Doping for Application in Multi-Resurf Devices," IEEE 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21.sub.—Tyson.sub.—P.PD-F#search='nonvolatile%20high%20density%20high%20performance%20 phase%20chan-ge%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era—vol. 4, pp. 674-679, 2004.

Wuttig, Matthias, "Towards a Universal Memory?" Nature Materials, Apr. 2005, pp. 265-266, vol. 4.

Yamada, Noboru, "Potential of Ge-Sb-Te phase-change optical disks for high-data-rate recording in the near future," (Conference Proceedings Paper), Jul. 30, 1997, vol. 3109, 10 pages.

Yi, J. H. et al., "Novel Cell Structure of PRAM with Thin Metal Layer Inserted GeSbTe," IEEE IEDM 2003, 4 pages.

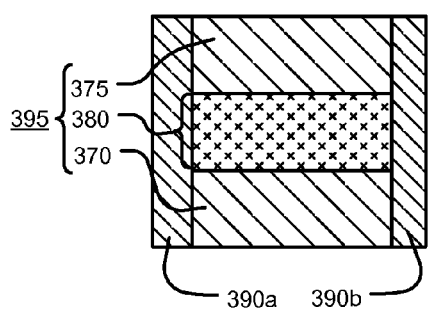
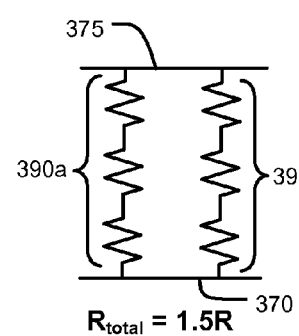
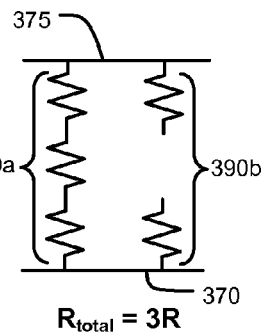
Fig. 5A     Fig. 5B     Fig. 5C
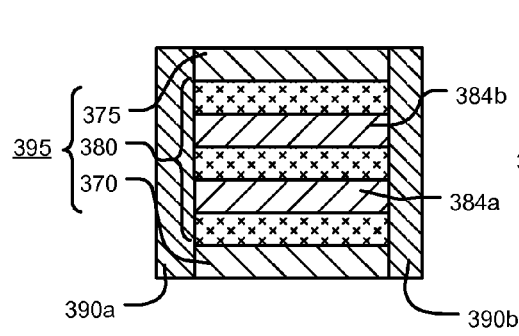
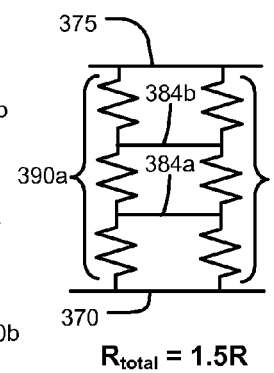
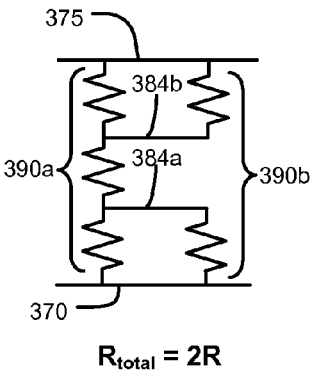
Fig. 5D     Fig. 5E     Fig. 5F

THERMALLY STABILIZED ELECTRODE STRUCTURE

RELATED APPLICATIONS

This application is a divisional of co-pending U.S. patent application Ser. No. 12/054,861, filed on 25 Mar. 2008, which application is incorporated as if fully set forth herein.

PARTIES TO A JOINT RESEARCH AGREEMENT

International Business Machines Corporation, a New York corporation; Macronix International Corporation, a Taiwan corporation, and Infineon Technologies A.G., a German corporation, are parties to a Joint Research Agreement.

BACKGROUND OF THE INVENTION

1. Field of the Invention

The present invention relates to high density memory devices based on phase change based memory materials, including chalcogenide based materials and other programmable resistive materials, and to methods for manufacturing such devices.

2. Description of Related Art

Phase change based materials, like chalcogenide based materials and similar materials, can be caused to change phase by application of electrical current at levels suitable for implementation in integrated circuits. The generally amorphous state is characterized by higher electrical resistivity that the generally crystalline state, which can be readily sensed to indicate data. These properties have generated interest in using programmable resistive material to form nonvolatile circuits, which can be read and written with random access.

The change from the amorphous to the crystalline state is generally a lower current operation. The change from crystalline to amorphous, referred to as reset herein, is generally a higher current operation, which includes a short high current density pulse to melt or break down the crystalline structure, after which the phase change material cools quickly, quenching the phase change process, allowing at least a portion of the phase change structure to stabilize in the amorphous state. It is desirable to minimize the magnitude of the reset current used to cause transition of phase change material from the crystalline to the amorphous state. The magnitude of the current needed for reset current can be reduced by reducing the size of the phase change material element in the cell and/or the contact area between electrodes and the phase change material, so that higher current densities are achieved with small absolute current values through the phase change material element.

A specific issue arising in phase change memory structures is the heat sink effect of the electrodes in contact with the phase change material. Because the phase change occurs as a result of heating, the relatively high thermal conductivity of the electrodes will act to draw heat away from the phase change material, resulting in a need for higher current to induce the desired phase change.

It is therefore desirable to provide a structure addressing the electrode heat sink issues described above, resulting in memory cell structures having low reset currents, and methods for manufacturing such structures which meet the tight process variation specifications needed for large-scale memory devices.

SUMMARY OF THE INVENTION

A memory device as described herein includes a first electrode layer comprising a first electrode material and a second electrode layer comprising a second electrode material. The device includes a thermal isolation structure comprising a layer of thermal isolation material between the first and second electrode layers. The thermal isolation material has a thermal conductivity less than that of the first and second electrode materials. The first and second electrode layers and the thermal isolation structure define a multi-layer stack having a sidewall. A sidewall conductor layer comprising a sidewall conductor material is on the sidewall of the multi-layer stack, the sidewall conductor material having an electrical conductivity greater than that of the thermal isolation material. A memory element comprising memory material is on the second electrode layer.

A method for manufacturing a memory device as described herein includes forming a multi-layer stack having a sidewall and comprising a first electrode layer comprising a first electrode material, a second electrode layer comprising a second electrode material, and a thermal isolation structure comprising a layer of thermal isolation material between the first and second electrode layers. The thermal isolation material has a thermal conductivity less than that of the first and second electrode materials. In some embodiments the thermal isolation material comprises dielectric material. The method includes forming a sidewall conductor layer comprising a sidewall conductor material on the sidewall of the multi-layer stack. The sidewall conductor material has an electrical conductivity greater than that of the thermal isolation material. The method further includes forming a memory element comprising memory material on the second electrode layer.

The structures described herein reduce the amount of heat drawn away from the memory element, effectively increasing the amount of heat generated within the memory element per unit value of current and thus reducing the amount of current required to induce a phase change. The thermal isolation structure comprises a material having a thermal conductivity less than the materials of the first and second electrode layers, thereby restricting heat flow away from the active region of the memory element. The thermal isolation material increases the thermal impedance between the memory element and high thermal capacity access circuitry and/or bias structures. The thermal isolation material may also have a thermal conductivity less than that of the sidewall conductor material, thereby concentrating the heat flow to within the sidewall conductor layer. The sidewall conductor layer can be formed using thin film deposition techniques of material on the sidewall, and thus the width can be less than a process, typically a lithographic process, used to form the multi-layer stack. The small width of the sidewall conductor layer increases the thermal resistance of the structure, thus restricting the amount of heat flow away from the memory element.

Other aspects and advantages of the present invention can be seen on review of the drawings, the detailed description, and the claims which follow.

BRIEF DESCRIPTION OF THE DRAWINGS

FIG. 5A-F illustrate improved reliability of memory cells having a multi-layer structure for the thermal protect structure.

DETAILED DESCRIPTION

Figure 1:
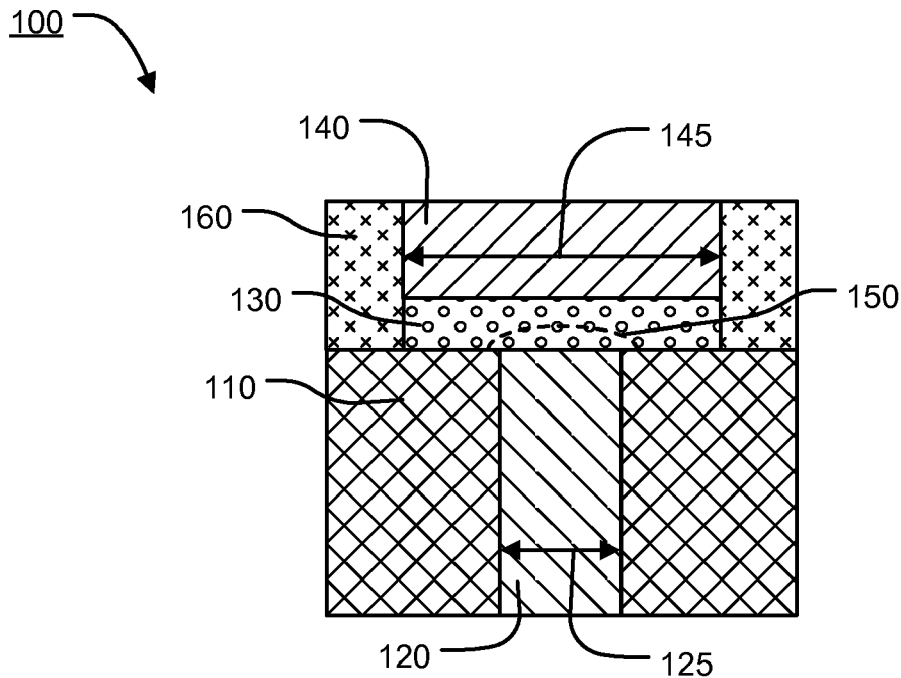
FIG. 1 illustrates a cross-sectional view of a prior art "mushroom" memory cell.

The following description of the invention will refer to specific structural embodiments and methods. It is understood that there is no intention to limit the invention to the specifically disclosed embodiments and methods but that the invention may be practiced using other features, elements, methods, and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

FIG. 1 illustrates a cross-sectional view of a prior art "mushroom" memory cell 100 having a bottom electrode 120 extending through a dielectric layer 110, a layer of phase change material 130 on the bottom electrode 120, and a top electrode 140 on the phase change material 130. A dielectric layer 160 surrounds the layer of phase change material 130. As can be seen in FIG. 1, the bottom electrode 120 has a width 125 less than the width 145 of the top electrode 140 and phase change material 130. Due to the differences in the widths 125 and 145, in operation the current density will be largest in the region of the phase change material 130 adjacent the bottom electrode 120, resulting in the active region 150 of the phase change material having a mushroom shape as shown in FIG. 1.

Because the phase change in the active region 150 occurs as a result of heating, the relatively high thermal conductivity of the bottom electrode 120 will act as a heat sink and draw heat away from the active region 150, resulting in a need for higher current to induce the desired phase change in the active region 150.

Figure 2:
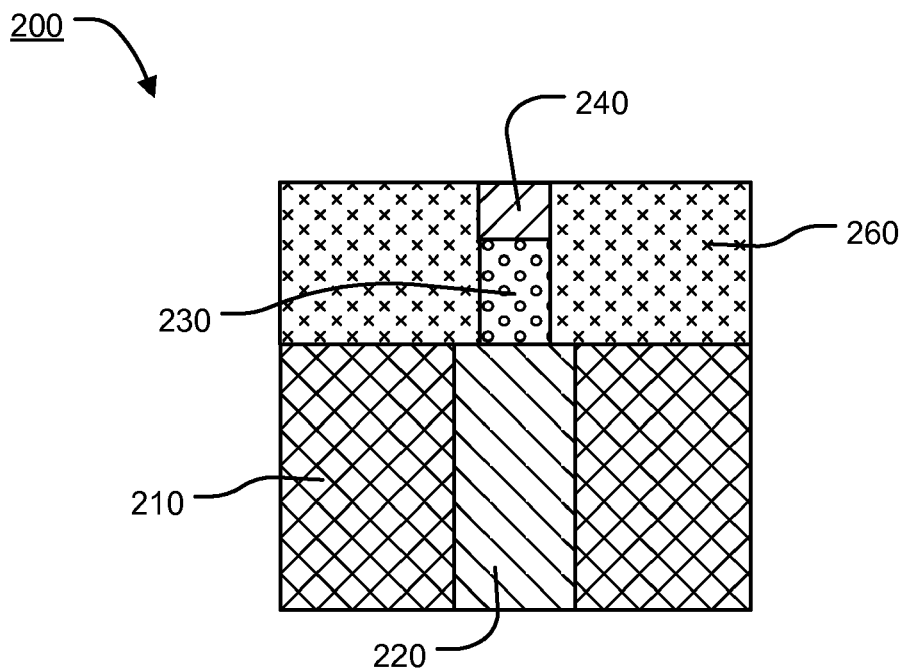
FIG. 2 illustrates a cross-sectional view of a prior art "pillar-type" memory cell.

FIG. 2 illustrates a cross-sectional view of a prior art "pillar-type" memory cell 200. The memory cell 200 includes a bottom electrode 220 in a dielectric layer 210, a pillar of phase change material 230 on the bottom electrode 220, and a top electrode 240 on the pillar of phase change material 230. A dielectric layer 260 surrounds the pillar of phase change material 230. In operation the conductive top and bottom electrodes 240, 220 act as a heat sink, the relatively high thermal conductivity of the electrodes 240, 220 rapidly drawing heat away from the phase change material 230. The heat sink effect of the electrodes 240, 220 results in a need for higher current to induce the desired phase change.

Figure 3:
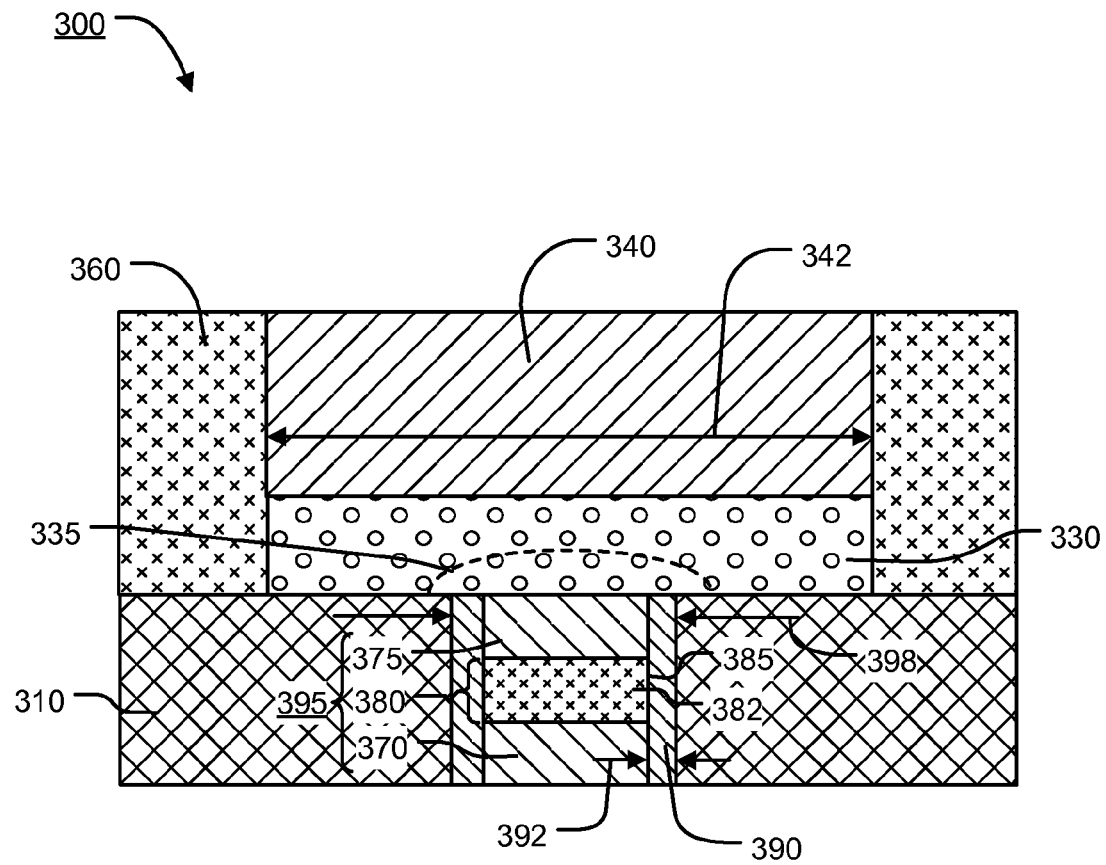
FIG. 3 illustrates a cross-sectional view of a memory cell addressing the heat sink issues of the bottom electrode.

FIG. 3 illustrates a cross-sectional view of a memory cell 300 addressing the heat sink issues described above.

The memory cell 300 includes a first electrode layer 370, a thermal isolation structure 380 on the first electrode layer 370, and a second electrode layer 375 on the thermal isolation structure 380. The thermal isolation structure 380 comprises a layer 382 of thermal isolation material having a thermal conductivity less than that of the materials of the first and second electrode layers 370, 375. The thermal isolation material may comprise, for example, has a low thermal conductivity kappa "k" dielectric material such as silicon dioxide, silicon oxynitride, silicon nitride, $Al_2O_3$, or other low k dielectric. Alternatively, the thermal isolation material may comprise, for example, one or more elements selected from the group consisting of Si, Ti, Al, Ta, N, O, C, including highly N-doped TaSiN, TaN, TiN, SiN, AlN, and $Al_2O_3$.

The first and second electrode layers 370, 375 and the thermal isolation structure 380 define a multi-layer stack 395 having a sidewall 385. A sidewall conductor layer 390 is on the sidewall 385 of the multi-layer stack 395. The sidewall conductor layer 390 comprises conductive material having an electrical conductivity greater than that of the thermal isolation material of layer 382, and thus provides a relatively low resistance electrical current path between the first electrode layer 370 and the second electrode layer 375. In the illustrated embodiment the sidewall conductor layer 390 surrounds the multi-layer stack 395. Alternatively, the sidewall conductor layer 390 may comprise a plurality of sidewall conductor members on the sidewall 385 to electrically couple the first electrode layer 370 to the second electrode layer 375.

The multi-layer stack 395 and the sidewall conductor layer 390 act as a bottom electrode for the memory cell 300, and are surrounded by dielectric 310. A memory element 330 is on the top surfaces of the second electrode layer 375 and sidewall conductor layer 390, and a top electrode 340 is on the memory element 330. The memory element 330 and the top electrode 340 are surrounded by a dielectric 360.

The memory element 330 may comprise one or more materials from the group of Ge, Sb, Te, Se, In, Ti, Ga, Bi, Sn, Cu, Pd, Pb, Ag, S, Si, O, P, As, N and Au.

The first and second electrode layers 370, 375 and the sidewall conductor layer 390 may each comprise, for example, TiN or TaN. TiN may be preferred for the second electrode layer 375 and the sidewall conductor layer 390 in embodiments in which the memory element 330 comprises GST (discussed below) because it makes good contact with GST, it is a common material used in semiconductor manufacturing, and it provides a good diffusion barrier at the higher temperatures at which GST transitions, typically in the 600-700° C. range. Alternatively, the first and second electrode layers 370, 375 and the sidewall conductor layer 390 may each comprise one or more materials from the group of Ti, W, Mo, Al, Ta, Cu, Pt, Ir, La, Ni, N, O, and Ru and combinations thereof.

In operation, voltages on the top electrode 340 and the first electrode layer 370 can induce current to flow from the first electrode layer 370 to the top electrode 340, or vice versa, via the multi-layer stack 395, the sidewall conductor layer 390, and the memory element 330.

The active region 335 is the region of the memory element 330 in which memory material is induced to change between at least two solid phases. The active region 335 can be made extremely small in the illustrated structure, thus reducing the magnitude of current needed to induce a phase change. The multi-layer stack 395 and the sidewall conductor layer 390 have a total width 398 (which in some embodiments is a diameter) less than the width 342 of the memory element 330 and the top electrode 340. The difference in width 398, 342 concentrates current density in the memory element 330, thereby reducing the magnitude of current needed to induce a phase change in the active region 335.

The multi-layer stack 395 and the sidewall conductor layer 390 reduce the amount of heat drawn away from the active region 335 compared to that of the bottom electrode 120 of FIG. 1, effectively increasing the amount of heat generated within the active region 335 per unit value of current. The thermal isolation layer 382 comprises a thermal isolation material having a thermal conductivity less than the materials of the first and second electrode layers 370, 375, thereby restricting heat flow away from the active region 335 of the memory element 330. The thermal isolation material may also have a thermal conductivity less than that of the sidewall conductor material, thereby concentrating the heat flow to within the sidewall conductor layer 390. The sidewall conductor layer 390 can be formed using thin film deposition techniques of material on the sidewall 385, and thus the width 392 can be less than a process, typically a lithographic process, used to form the multi-layer stack 395. The small width 392 of the sidewall conductor layer 390 increases the thermal resistance of the structure, thus restricting the amount of heat flow from the active region 335. The width 392 may be, for example, between about 0.3 nm and 20 nm, for example being about 5 nm. Additionally, dielectric 310 preferably comprises material which provides some additional thermal isolation to the active region 335.

Embodiments of the memory cell 300 include phase change based memory materials, including chalcogenide based materials and other materials, for the memory element 330 respectively. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112, cols. 10-11.) Particular alloys evaluated by another researcher include Ge2Sb2Te5, GeSb2Te4 and GeSb4Te7 (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including $N_2$ doped GST, $Ge_xSb_y$, or other material that uses different crystal phase changes to determine resistance; $Pr_xCa_yMnO_3$, $Pr_xSr_yMnO_3$, $ZrO_x$, or other material that uses an electrical pulse to change the resistance state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, C60-TCNQ, TCNQ doped with other metal, or any other polymer material that has a bistable or multi-stable resistance state controlled by an electrical pulse.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously.

A post-deposition annealing treatment in a vacuum or in an $N_2$ ambient is optionally performed to improve the crystallize state of chalcogenide material. The annealing temperature typically ranges from 100° C. to 400° C. with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states In the illustrated embodiment of FIG. 3 the thermal isolation structure 380 comprised a single layer 382 of thermal isolation material. Additional thermal isolation may be achieved in embodiments in which the thermal isolation structure 380 comprises a plurality of thermal isolation material layers separated by inter-conductor layers comprising electrically conductive material. For example the isolation structure 380 may comprise first and second layers of thermal isolation material separated by an inner-conductor layer comprising material having a higher electrical conductivity than that of the thermal isolation material. As another example, described in more detail below with reference to FIG. 4, the thermal isolation structure may comprise three layers of thermal isolation material each separated by an inter-conductor layer.

Figure 4:
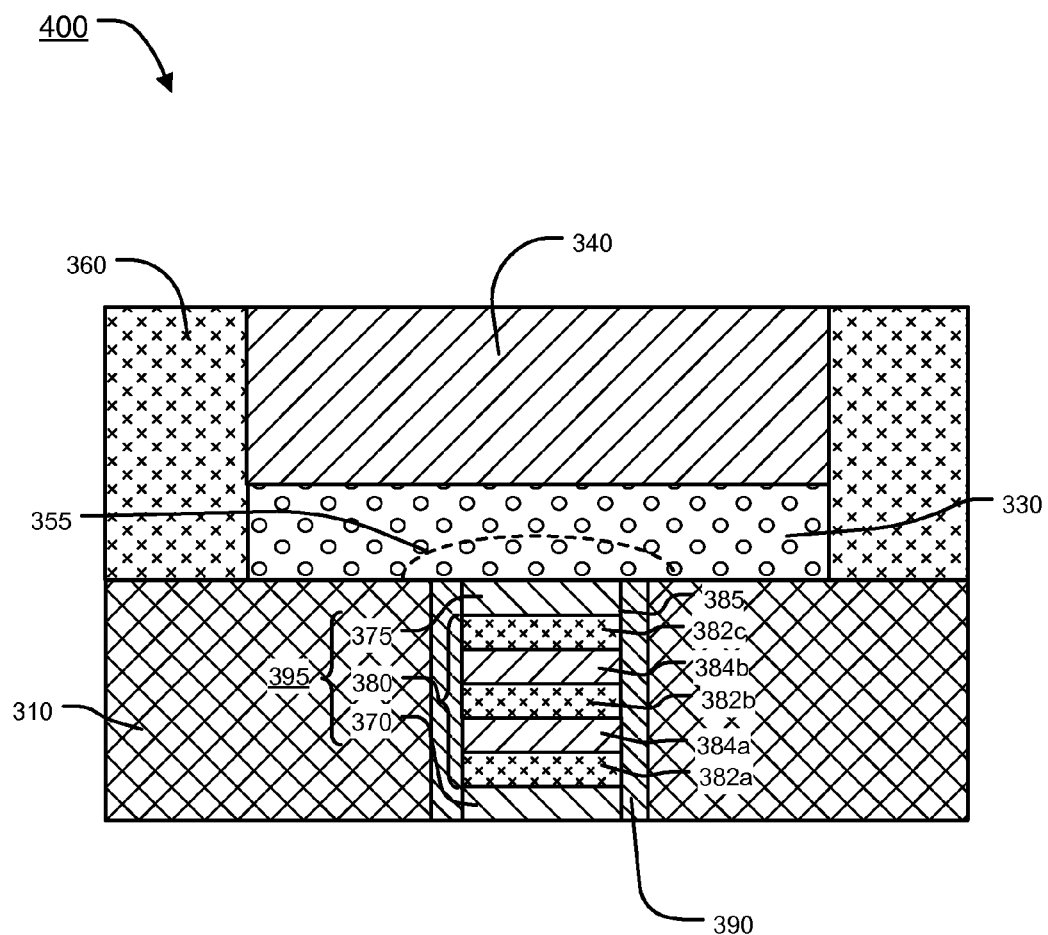
FIG. 4 illustrates a cross-sectional view of a memory cell having a multi-layer structure for the thermal protect structure.

FIG. 4 illustrates a memory cell 400 similar to that of the memory cell 300 of FIG. 3 except that the thermal protect structure 380 comprises a multi-layer structure of alternating layers 382 comprising thermal isolation material and layers 384 of inter-conductor material.

In FIG. 4 the thermal protect structure 380 comprises a first layer 382a of thermal isolation material on the first electrode layer 370, a first inter-conductor layer 384a on the first layer 382a of the thermal isolation material, a second layer 382b of thermal isolation material on the first inter-conductor layer 384a, a second inter-conductor layer 384b on the second layer 382b of thermal isolation material, and a third layer 382c of thermal isolation material on the second inter-conductor layer 384b.

The multi-layer thermal protect structure 380 of FIG. 4 can provide additional thermal protection to the active region 355 of the memory element without increasing the electrical resistance between the first electrode layer 370 and the memory element 330. The layers 382, 384 can be formed by thin film deposition techniques such that each layer has a thickness, for example, between about 5 Å and 100 Å. Using thin layers 382, 384 can result in improved thermal isolation without increasing the electrical resistance compared to a single layer of thermal protect structure 380.

Additionally, as illustrated in FIGS. 5A-5E and discussed in more detail below, the inter-conductor layers 382 provide additional benefits including improved reliability and lower overall resistance in the instance of a failure of a portion of the sidewall conductor layer 390.

FIG. 5A illustrates the thermal protect structure 380 comprising a single layer of thermal protect material, and the sidewall conductor layer 390 not completely surrounding the multi-layer stack 395 and instead comprising a first sidewall conductor member 390a and a second conductive sidewall member 390b.

FIG. 5B illustrates an equivalent electrical circuit of the structure of FIG. 5A, with each conductive sidewall member 390a, 390b represented by three series resistors having a resistance R. Thus, the circuit of FIG. 5B has a total resistance of 1.5R.

As shown in FIG. 5C, if the member 390b fails and results in an electrical open, current cannot in the member 390b and the resistance of the structure of FIG. 5A will double to 3R.

FIG. 5D illustrates the thermal protect structure 380 comprising a multi-layer structure, and the sidewall conductor layer 390 not completely surrounding the multi-layer stack 395 and instead comprising a first sidewall conductor member 390a and a second conductive sidewall member 390b.

FIG. 5E illustrates an equivalent circuit of the structure of FIG. 5A, with each conductive sidewall member 390a, 390b represented by three series resistance having a resistance R. Thus, the circuit of FIG. 5E has a resistance 1.5R.

As shown in FIG. 5F, the inter-conductor layers 384 provide a current path between members 390a, 390b which results in a resistance of 2R in the case of a failure of a portion of member 390b. In the case of a failure in a portion of member 390b, the current will not be entirely concentrated in member 390a since the inter-conductor layers 384 may allow current to flow in portions of the member 390b. This distribution of the current in both members 390a, 390b due to the inter-conductor layers 384 can result in improved reliability since even a failure in a portion of each of the sidewall members 390a, 390b may result in a current path still existing between the first electrode element 370 and the second electrode element 375.

Figure 6:
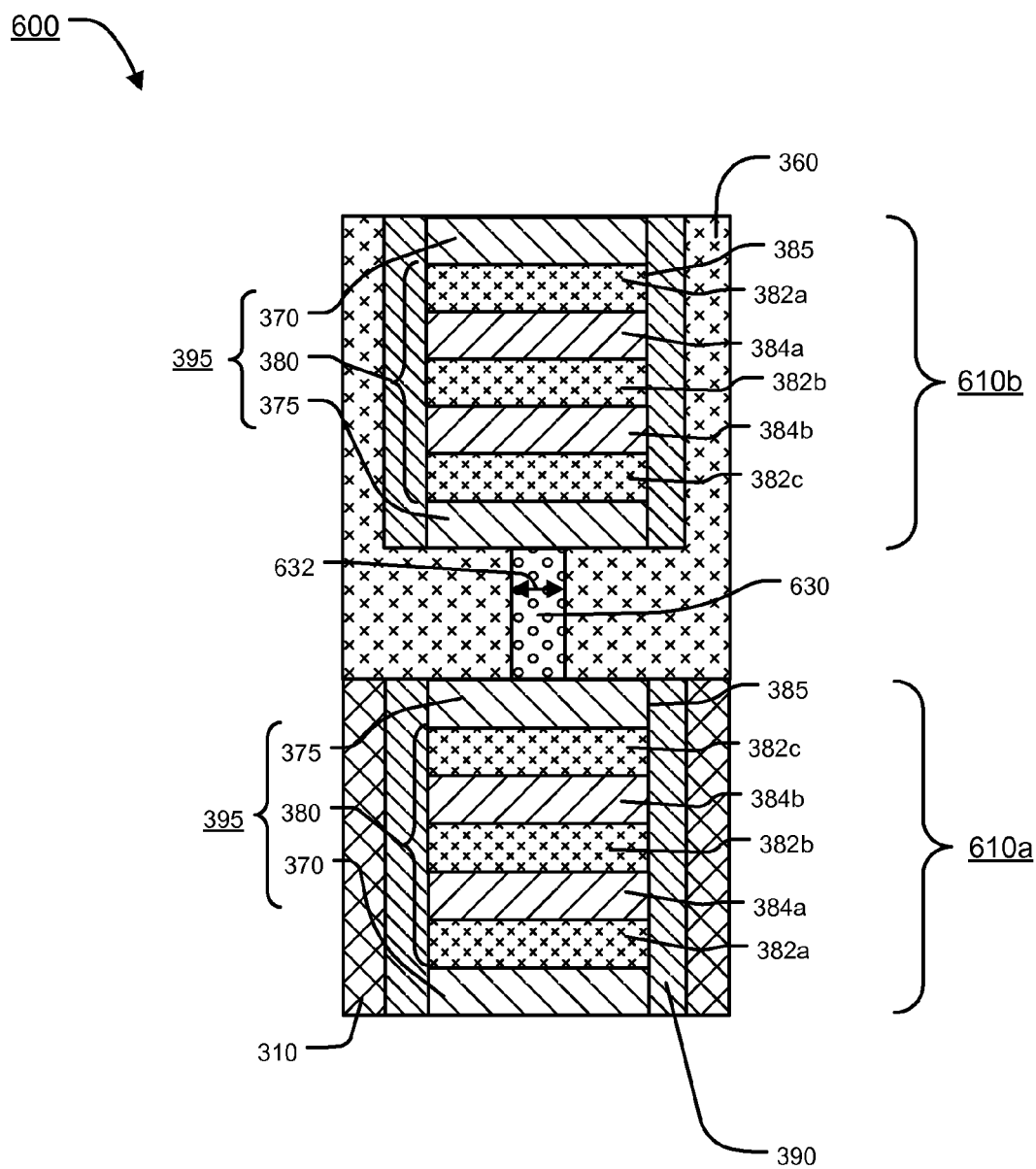
FIG. 6 illustrates a cross-sectional view of a memory cell addressing the heat sink issues of the top and bottom electrodes.

FIG. 6 shows a cross-sectional view of a memory cell 600 having a first electrode element 610a acting as a bottom electrode and a second electrode element 610b acting as a top electrode, addressing the issues of the heat sink effect of each of the electrodes.

Each electrode element 610 includes a first electrode layer 370, a thermal isolation structure 380 on the first electrode layer 370, and a second electrode layer 375 on the thermal isolation structure 380. The thermal isolation structure 380 comprises a multi-layer structure as illustrated in FIG. 4. Alternative embodiments of the thermal isolation structure 380 as discussed above may also be used.

The memory cell 600 also includes a pillar shaped memory element 630 having a width 632 (which in some embodiments is a diameter) less than that of the first and second electrode elements 610a, 610b. The memory element 630 comprises memory material and contacts the second electrode layers 375 of the first and second electrode elements 610a, 610b.

In operation, the first and second electrode elements 610 reduce the amount of heat drawn away from the memory element 630 compared to that of the top and bottom electrodes 240, 220, effectively increasing the amount of heat generated within the memory element per unit value of current. The second electrode layers 375 also provide a relatively large contact surface available to the memory element 630, which can address process variations which result in alignment tolerance issues and allow for improved manufacturability of the cell.

FIGS. 7-11 illustrate steps in a fabrication sequence for manufacturing a memory cell as illustrated in FIG. 4.

Figure 7:
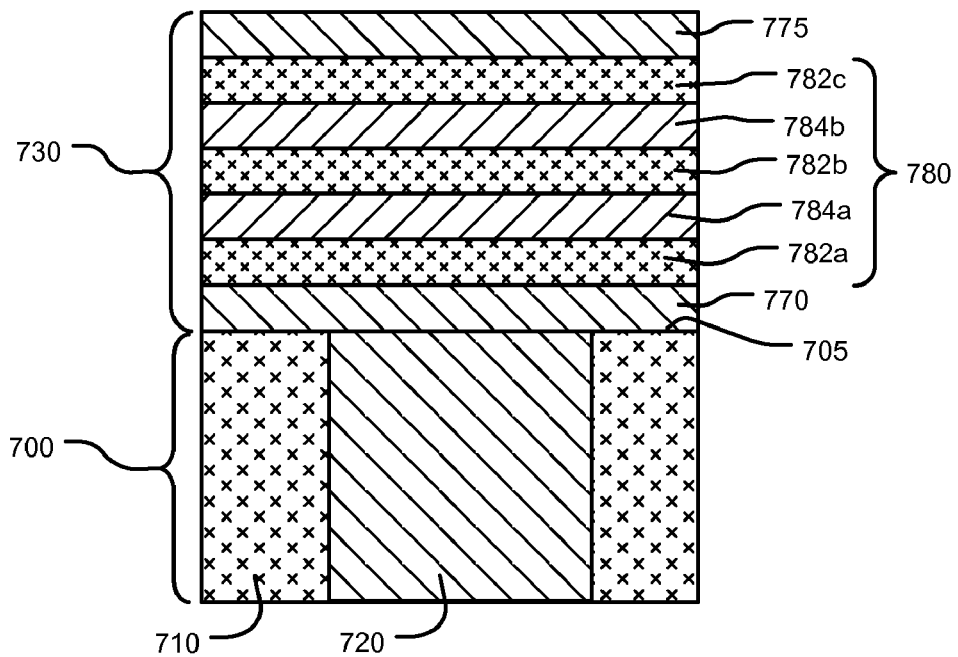
FIGS. 7-11 illustrate steps in a fabrication sequence for manufacturing a memory cell as illustrated in FIG. 4.

FIG. 7 illustrates forming a multi-layer structure 730 on a top surface 705 of a memory access layer 700. The memory access layer 700 includes a conductive plug 720 extending through dielectric 710 to underlying access circuitry (not shown) such as an access transistor.

The multi-layer structure 730 comprises a layer 770 of first electrode material, thermal isolation structure material 780 on the layer 770 of first electrode material, and a layer 775 of second electrode material on the thermal isolation structure material 780.

In the illustrated embodiment the thermal isolation structure material 780 comprises three layers 782a, 782b, 782c of thermal isolation material each separated by a layer 784a, 784b of inter-conductor material. Alternatively, more or less layers of thermal isolation material as described above can be used.

Figure 8:
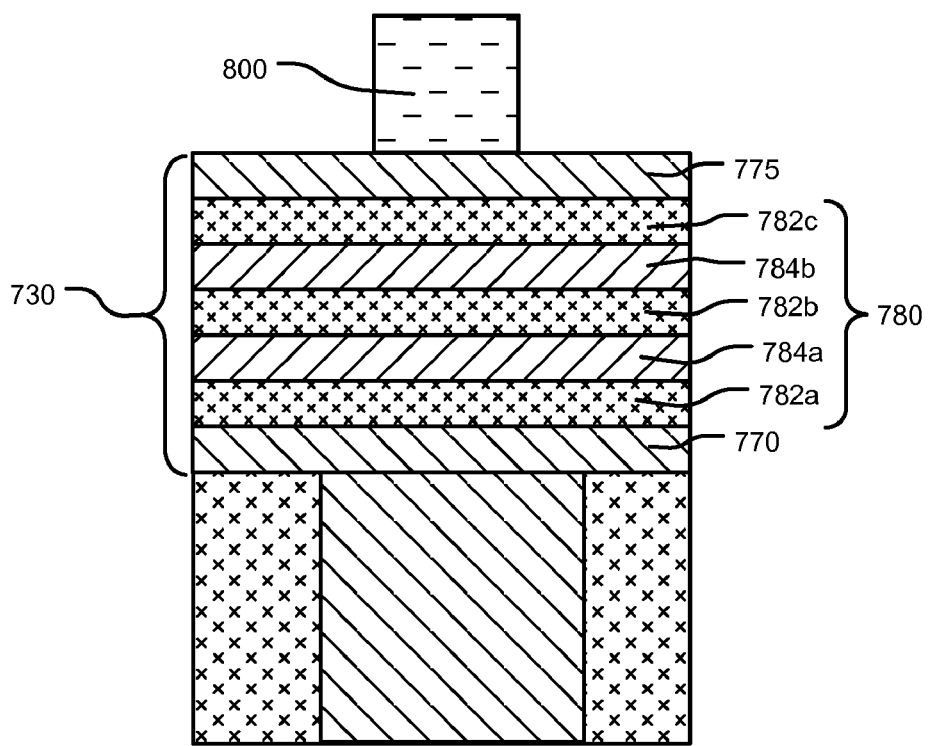

Next, a mask element 800 is formed on the structure illustrated in FIG. 7, resulting in the structure illustrated in FIG. 8. In the illustrated embodiment the mask element 800 comprises patterned photoresist material.

Figure 9:
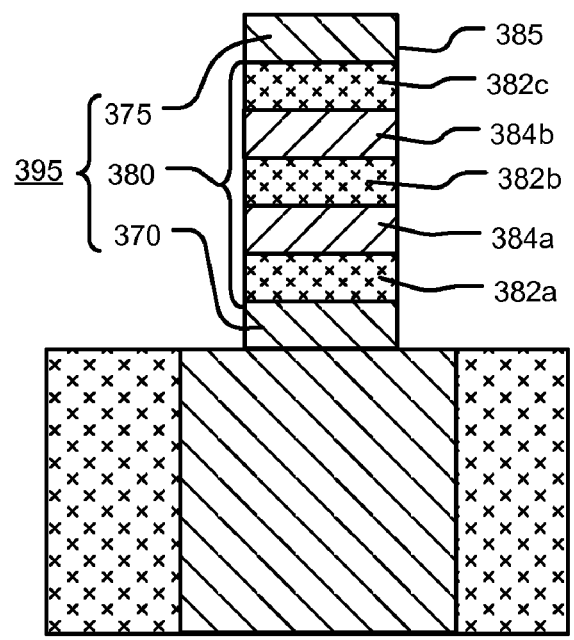

Next, the multi-layer structure 730 is etched using the mask element 800 as an etch mask to form multi-layer stack 395, and the mask element 800 is removed resulting in the structure illustrated in FIG. 9. The multi-layer stack 395 has a sidewall 385 and comprises first electrode layer 370, thermal protect structure 380 on the first electrode layer 370, and second electrode layer 375 on the thermal protect structure 380.

Figure 10:
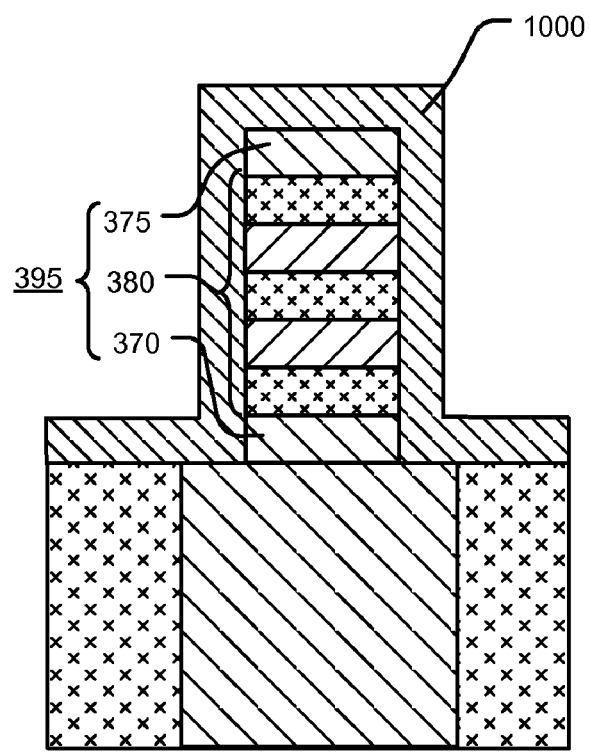

Next, a conformal layer 1000 of sidewall conductor material is formed on the structure illustrated in FIG. 9 including on the multi-layer stack 395, resulting in the structure illustrated in FIG. 10.

Figure 11:
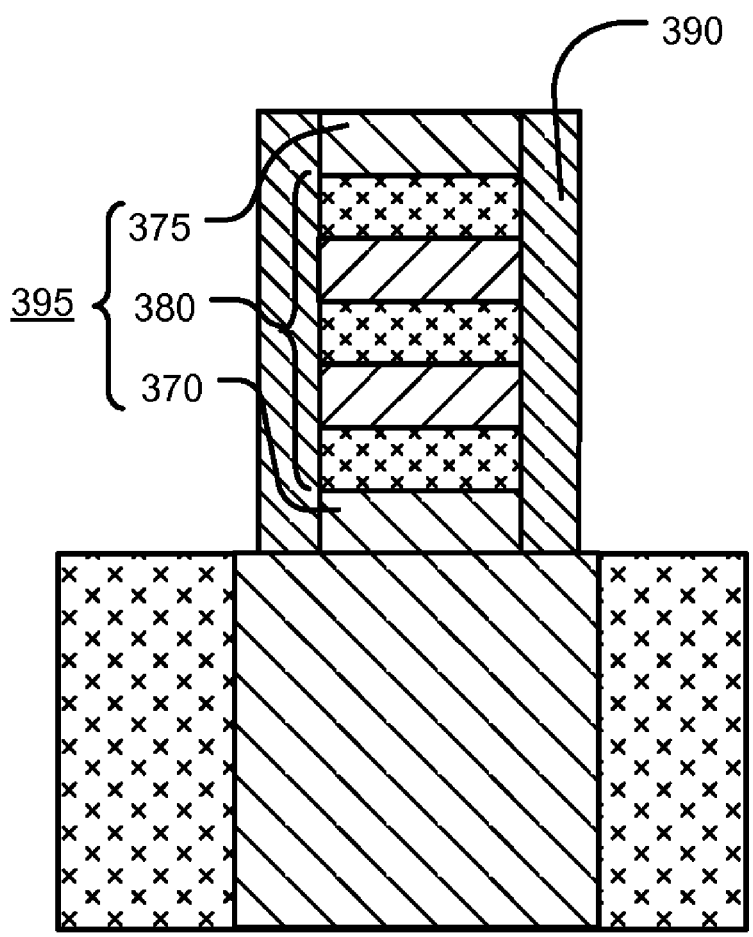

Next, the layer 1000 is anisotropically etched to expose a top surface of the second electrode layer 375 of the multi-layer stack 395, thereby forming sidewall conductor layer 390 as illustrated in FIG. 11.

Next, dielectric layer 310 can be formed on the structure illustrated FIG. 11 and planarized using, for example, Chemical Mechanical Polishing CMP. A layer of phase change material and top electrode material can be formed and patterned to form memory element 330 and top electrode 340, resulting in the structure illustrated in FIG. 4.

Figure 12:
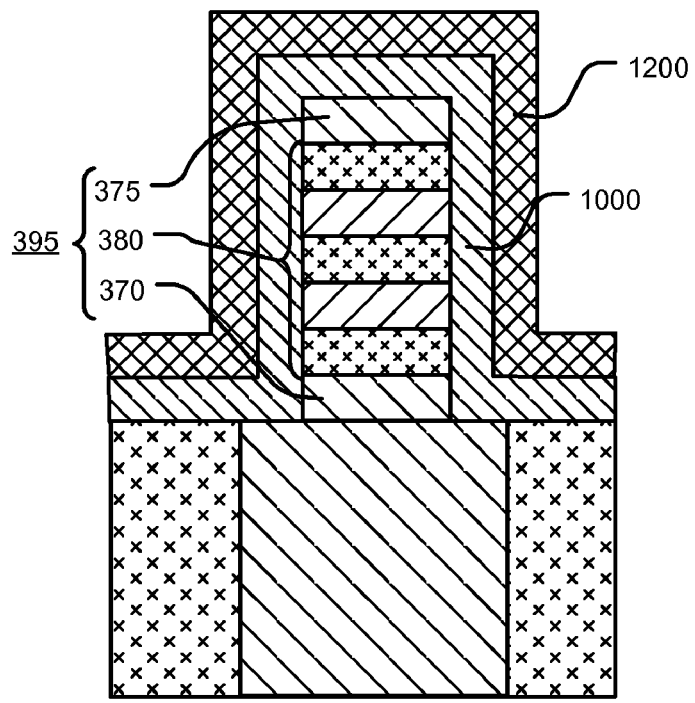
FIGS. 12-13 illustrate an alternative manufacturing process to that illustrated in FIG. 11.
Figure 13:
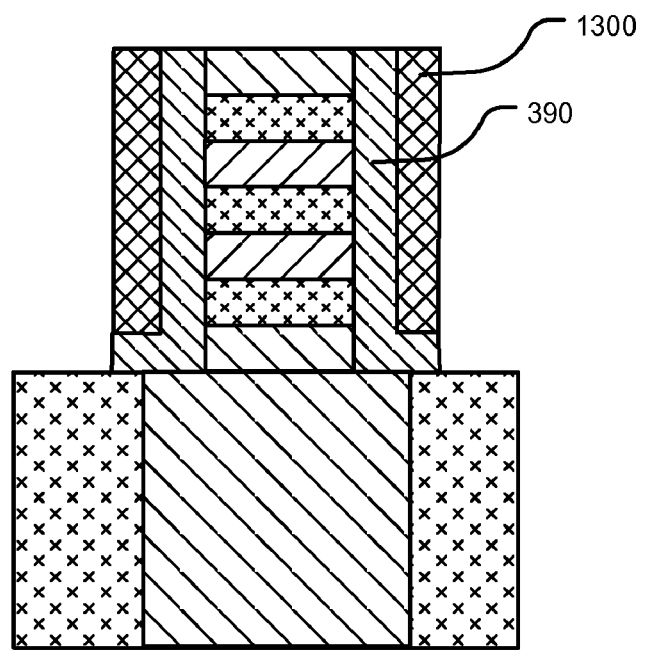

FIG. 12-13 illustrate an alternative manufacturing process to that illustrated in FIG. 11.

FIG. 12 illustrates forming a conformal dielectric layer 1200 on the conformal layer 1000 of sidewall conductor material of FIG. 10.

Next, the layers 1000 and 1200 are anisotropically etched to expose a top surface of the second electrode layer 375 of the multi-layer stack 395, thereby forming sidewall conductor layer 390 and a sidewall dielectric spacer 1300 as illustrated in FIG. 13.

Figure 14:
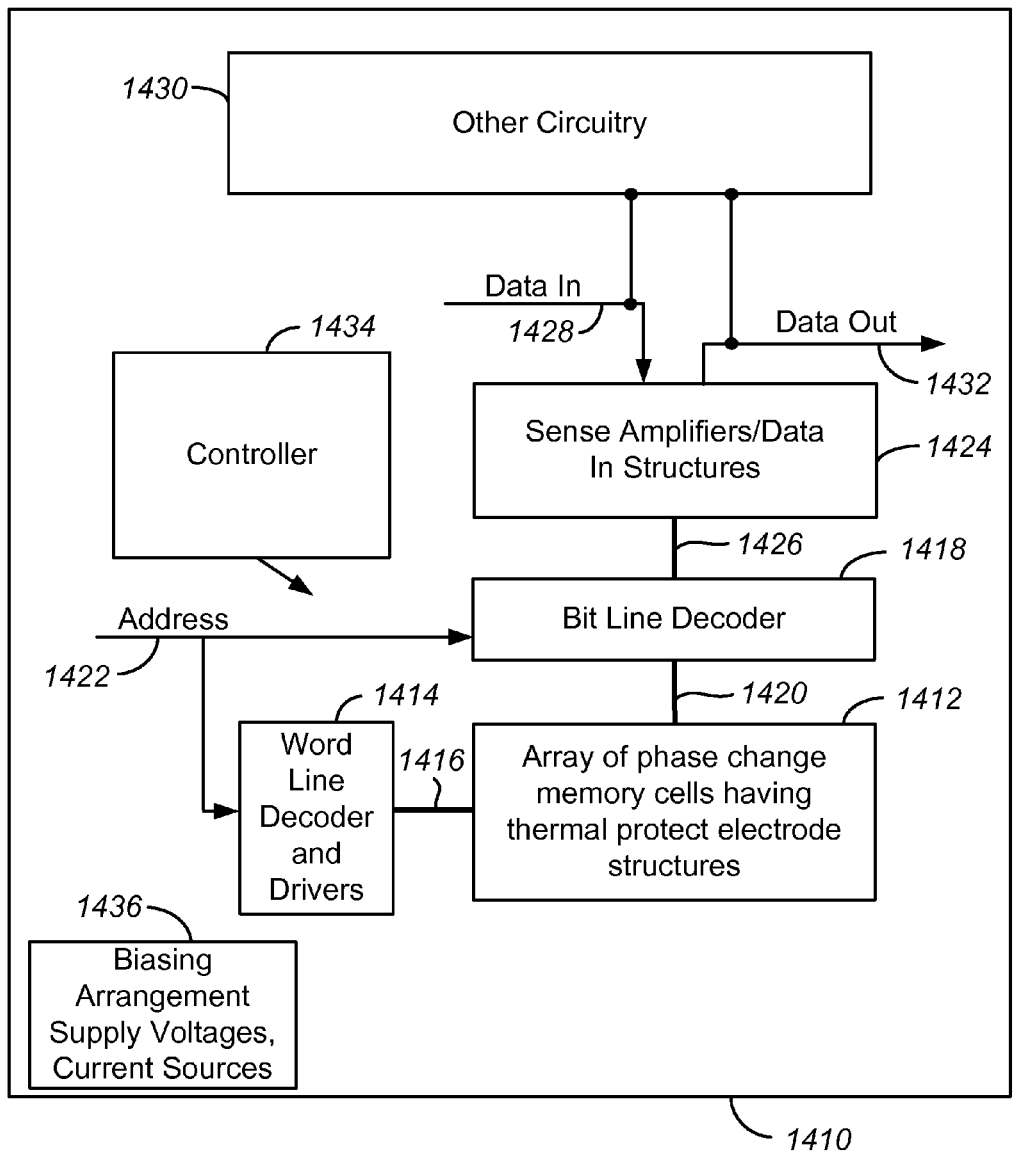
FIG. 14 is a simplified block diagram of an integrated circuit including a memory array implemented using memory cells having a thermal protect electrode structure as described herein.

FIG. 14 is a simplified block diagram of an integrated circuit 1410 including a memory array 1412 implemented using memory cells having thermal protect electrode structures as described herein. A word line decoder 1414 having read, set and reset modes is coupled to and in electrical communication with a plurality of word lines 1416 arranged along rows in the memory array 1412. A bit line (column) decoder 1418 is in electrical communication with a plurality of bit lines 1420 arranged along columns in the array 1412 for reading, setting, and resetting the phase change memory cells (not shown) in array 1412. Addresses are supplied on bus 1422 to word line decoder and drivers 1414 and bit line decoder 1418. Sense amplifiers and data-in structures in block 1424, including voltage and/or current sources for the read, set, and reset modes are coupled to bit line decoder 1418 via data bus 1426. Data is supplied via a data-in line 1428 from input/output ports on integrated circuit 1410, or from other data sources internal or external to integrated circuit 1410, to data-in structures in block 1424. Other circuitry 1430 may be included on integrated circuit 1410, such as a general purpose processor or special purpose application circuitry, or a combination of modules providing system-on-a-chip functionality supported by array 1412. Data is supplied via a data-out line 1432 from the sense amplifiers in block 1424 to input/output ports on integrated circuit 1410, or to other data destinations internal or external to integrated circuit 1410.

A controller 1434 implemented in this example, using a bias arrangement state machine, controls the application of bias arrangement supply voltages and current sources 1436, such as read, program, erase, erase verify and program verify voltages and/or currents. Controller 1434 may be implemented using special-purpose logic circuitry as known in the art. In alternative embodiments, controller 1434 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 1434.

Figure 15:
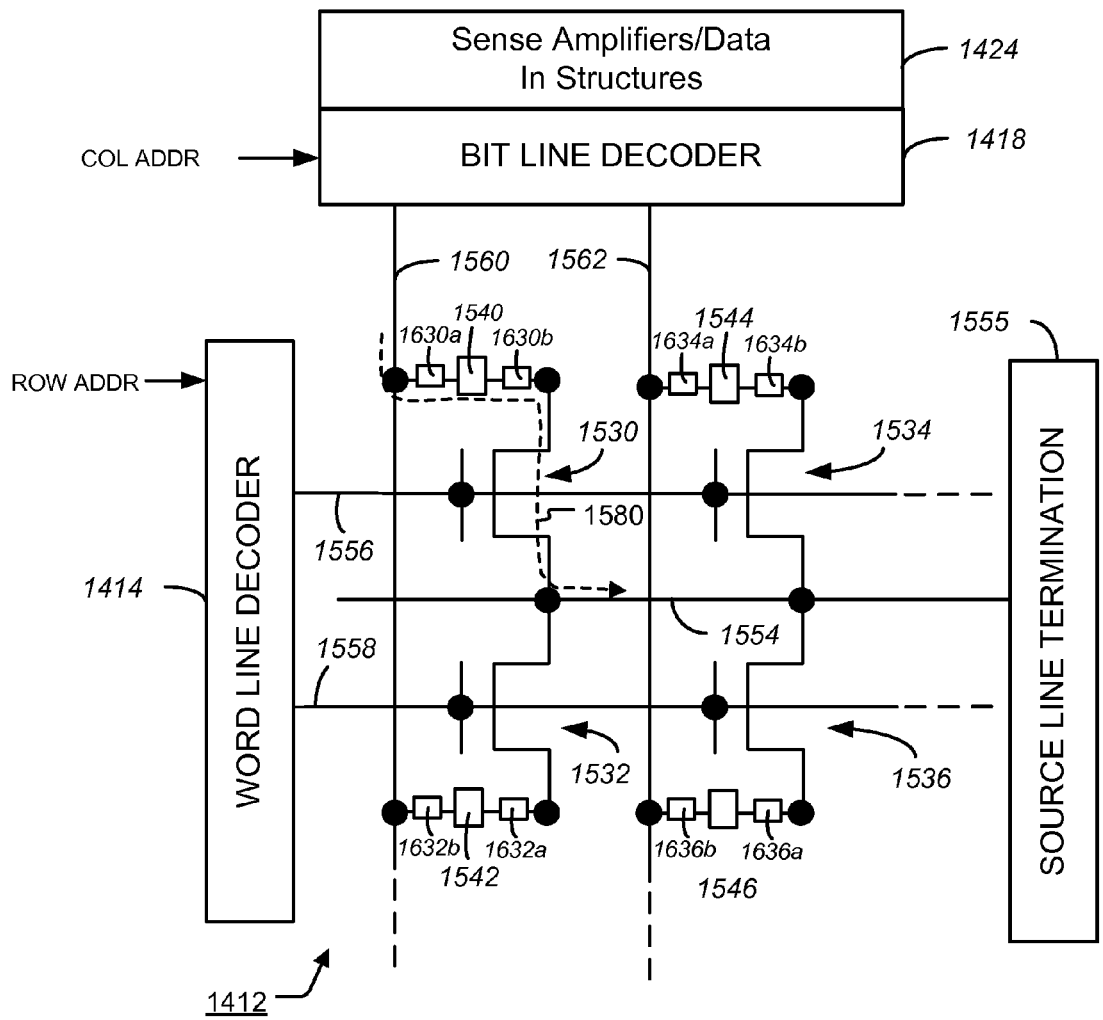
FIG. 15 illustrates a portion of the memory array.

As shown in FIG. 15, each of the memory cells of array 1412 includes an access transistor (or other access device such as a diode) and phase change material element. In FIG. 15 four memory cells 1530, 1532, 1534, 1536 having respective memory elements 1540, 1542, 1544, 1546 are illustrated, representing a small section of an array that can include millions of memory cells. Each of the memory cells 1530, 1532, 1534, 1536 also have respective first and second thermal protect electrodes 1630, 1632, 1634, 1636 adjacent the memory elements 1540, 1542, 1544, 1546. Each of the electrodes comprises first and second electrode layers, a thermal isolation structure having a sidewall, and a sidewall conductor layer as described herein. In the illustrated embodiment each memory cell includes first and second thermal protect electrodes (for example memory cell 1530 includes first and second thermal protect electrodes 1630a, 1630b). Alternatively, each memory cell may have a single thermal protect electrode.

Sources of each of the access transistors of memory cells 1530, 1532, 1534, 1536 are connected in common to source line 1554 that terminates in a source line termination circuit 1555, such as a ground terminal. In another embodiment the source lines of the access devices are not electrically connected, but independently controllable. The source line termination circuit 1555 may include bias circuits such as voltage sources and current sources, and decoding circuits for applying bias arrangements, other than ground, to the source line 1554 in some embodiments.

A plurality of word lines including word lines 1556, 1558 extend in parallel along a first direction. Word lines 1556, 1558 are in electrical communication with word line decoder 1414. The gates of access transistors of memory cells 1530 and 1534 are connected to word line 1556, and the gates of access transistors of memory cells 1532 and 1536 are connected in common to word line 1558.

A plurality of bit lines including bit lines 1560, 1562 extend in parallel in a second direction and are in electrical communication with bit line decoder 1418. In the illustrated embodiment each of the memory elements and thermal protect electrodes are arranged between the drain of the corresponding access device and the corresponding bit line. Alternatively, the memory elements and electrodes may be on the source side of the corresponding access device.

It will be understood that the memory array 1412 is not limited to the array configuration illustrated in FIG. 15, and additional array configurations can also be used. Additionally, instead of MOS transistors bipolar transistors or diodes may be used as access devices in some embodiments.

In operation each of the memory cells in the array 1412 store a data value depending upon the total resistance of the corresponding memory element. The data value may be determined, for example, by comparison of current on a bit line for a selected memory cell to that of a suitable reference current by sense amplifiers 1424. The reference current can be established to that a predetermined range of currents correspond to a logical "0", and a differing range of current correspond to a logical "1". In a memory cell having three or more states, reference currents can be established so that differing ranges of bit line currents correspond to each of the three or more states.

Reading or writing to a memory cell of array 1412, therefore, can be achieved by applying a suitable voltage to one of word lines 1558, 1556 and coupling one of bit lines 1560, 1562 to a voltage source so that current flows through the selected memory cell. For example, a current path 1580 through a selected memory cell (in this example memory cell 1530 and memory element 1540) is established by applying voltages to the bit line 1560, word line 1556, and source line 1554 sufficient to turn on the access transistor of memory cell 1530 and induce current in path 1580 to flow from the bit line 1560 to the source line 1554, or vice-versa. The level and duration of the voltages applied is dependent upon the operation performed, e.g. a reading operation or a writing operation.

In a reset (or erase) operation of the memory cell 1530, word line decoder 1414 facilitates providing word line 1456 with a suitable voltage pulse to turn on the access transistor of the memory cell 1530. Bit line decoder 1418 facilitates supplying a voltage pulse to bit line 1560 of suitable amplitude and duration to induce a current to flow though the memory element 1540, the current raising the temperature of an active region of the memory element 1540 above the transition temperature of the phase change material and also above the melting temperature to place the active region in a liquid state. The current is then terminated, for example by terminating the voltage pulses on the bit line 1560 and on the word line 1556, resulting in a relatively quick quenching time as the active region rapidly cools to stabilize to a high resistance generally amorphous phase. The reset operation can also comprise more than one pulse, for example using a pair of pulses.

In a set (or program) operation of the selected memory cell 1530, word line decoder 1414 facilitates providing word line 1556 with a suitable voltage pulse to turn on the access transistor of the memory cell 1530. Bit line decoder 1418 facilitates supplying a voltage pulse to bit line 1560 of suitable amplitude and duration to induce a current to flow through the memory element 1540, the current pulse sufficient to raise the temperature of at least a portion of the active region above the transition temperature and cause a transition in at least a portion of the active region from the generally amorphous phase into a low resistance generally crystalline phase, this transition lowering the resistance of the active regions and setting the memory cell to the desired state.

In a read (or sense) operation of the data value of the bit stored in the memory cell 1530, word line decoder 1414 facilitates providing word line 1556 with a suitable voltage pulse to turn on the access transistor of the memory cell 1530. Bit line decoder 1418 facilitates supplying a voltage to bit line 1560 of suitable amplitude and duration to induce current to flow through the memory element 1540 that does not result in the active region undergoing a change in resistive state. The current on the bit line 1560 and through the memory element 1540 is dependent upon the resistance of, and therefore the data state associated with, the memory cell. Thus, the data state of the memory cell may be determined by detecting if the resistance of the memory cell 1530 is above or below a threshold resistance, for example by comparison of the current on bit line 1560 with a suitable reference current by sense amplifier circuitry 1424.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for manufacturing a memory device, the method comprising:
   forming a multi-layer stack comprising a first electrode layer comprising a first electrode material, a second electrode layer comprising a second electrode material, and a thermal isolation structure comprising a layer of thermal isolation material between the first electrode layer and the second electrode layer, the thermal isolation material having a thermal conductivity less than that of the first electrode material and the second electrode material, the multi-layer stack having a sidewall;
   forming a sidewall conductor layer comprising a sidewall conductor material on the sidewall of the multi-layer stack, the sidewall conductor material having an electrical conductivity greater than that of the thermal isolation material, the multi-layer stack and the sidewall conductor layer defining an electrode structure; and
   forming a memory element comprising memory material on and in contact with the second electrode layer; and
   forming another electrode structure in contact with the memory element.

2. The method of claim 1, wherein the sidewall conductor layer has a width on the sidewall less than a minimum feature size for a lithographic process used to form the multi-layer stack.

3. The method of claim 1, wherein the sidewall conductor layer surrounds the multi-layer stack.

4. The method of claim 1, wherein the forming a sidewall conductor layer comprises forming a first sidewall conductor member and a second sidewall conductor member.

5. The method of claim 1, wherein forming the multi-layer stack further comprises:
   forming a multi-layer structure comprising a layer of the first electrode material, thermal isolation structure material on the layer of the first electrode material, and a layer of the second electrode material on the thermal isolation structure material;
   forming a mask element on the multi-layer structure; and
   etching the multi-layer structure using the mask element as an etch mask.

6. The method of claim 1, wherein the forming a sidewall conductor layer further comprises:
   forming a conformal layer of the sidewall conductor material on the multi-layer stack; and
   anisotropically etching the conformal layer of the sidewall conductor material to expose a top surface of the second electrode layer.

7. The method of claim 1, wherein forming the sidewall conductor layer further comprises:
   forming a conformal layer of the sidewall conductor material on the multi-layer stack;
   forming a conformal layer dielectric material on the conformal layer of the sidewall conductor material; and anisotropically etching the conformal layer dielectric material and the conformal layer of the sidewall conductor material to expose a top surface of the second electrode layer.

8. The method of claim 1, wherein the layer of thermal isolation material is on the first electrode layer, and the second electrode layer is on the layer of thermal isolation material.

9. The method of claim 1, wherein the layer of thermal isolation material is on the first electrode layer, and the thermal isolation structure further comprises:
   a first inter-conductor layer on the layer of thermal isolation material; and
   a second layer of thermal isolation material on the first inter-conductor layer, the second electrode layer on the second layer of thermal isolation material.

10. The method of claim 1, wherein the layer of thermal isolation material is on the first electrode layer, and the thermal isolation structure further comprises:
   a first inter-conductor layer on the layer of thermal isolation material;
   a second layer of thermal isolation material on the first inter-conductor layer;
   a second inter-conductor layer on the second layer of thermal isolation material; and
   a third layer of thermal isolation material on the second inter-conductor layer, the second electrode layer on the third layer of thermal isolation material.

11. The method of claim 1, wherein the memory material comprises one or more materials from the group of Ge, Sb, Te, Se, In, Ti, Ga, Bi, Sn, Cu, Pd, Pb, Ag, S, Si, O, P, As, N and Au.

12. The method of claim 1, wherein the first electrode layer and the second electrode layer and the sidewall conductor layer each comprises one or more materials from the group of Ti, W, Mo, Al, Ta, Cu, Pt, Ir, La, Ni, N, O, and Ru and combinations thereof.

13. The method of claim 1, wherein the layer of thermal isolation material comprises silicon dioxide.

14. The method of claim 1, wherein the layer of thermal isolation material comprises one of N-doped TaSiN, TaN, TiN, SiN, AlN, and $Al_2O_3$.

* * * * *